(12) United States Patent
Wang et al.

(10) Patent No.: US 11,392,003 B2
(45) Date of Patent: Jul. 19, 2022

(54) ACTIVE DEVICE SUBSTRATE AND METHOD FOR MANUFACTURING THE SAME

(71) Applicant: Au Optronics Corporation, Hsinchu (TW)

(72) Inventors: Cheng-Chan Wang, Hsinchu (TW); Tsai-Sheng Lo, Hsinchu (TW); Chia-Hsin Chung, Hsinchu (TW); Chih-Chiang Chen, Hsinchu (TW); Hui-Ku Chang, Hsinchu (TW); Sheng-Kai Lin, Hsinchu (TW); Chia-Po Lin, Hsinchu (TW); Ming-Jui Wang, Hsinchu (TW); Sheng-Ming Huang, Hsinchu (TW); Jen-Kuei Lu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 112 days.

(21) Appl. No.: 16/937,587

(22) Filed: Jul. 24, 2020

(65) Prior Publication Data

US 2021/0247652 A1    Aug. 12, 2021

(30) Foreign Application Priority Data

Feb. 6, 2020   (TW) ................... 109103664

(51) Int. Cl.
    *G02F 1/1333* (2006.01)
    *G02F 1/1362* (2006.01)
    (Continued)

(52) U.S. Cl.
    CPC ...... *G02F 1/136286* (2013.01); *G02F 1/1368* (2013.01); *G02F 1/133345* (2013.01);
    (Continued)

(58) Field of Classification Search
    CPC ......... G02F 1/136286; G02F 1/133345; G02F 1/136227; G02F 1/1368; G02F 1/136218;
    (Continued)

(56) References Cited

U.S. PATENT DOCUMENTS 7,932,135 B1    4/2011   Nam et al.
9,891,469 B2    2/2018   Wang
(Continued)

FOREIGN PATENT DOCUMENTS

CN    102044490    5/2011
CN    104991377    10/2015
(Continued)

*Primary Examiner* — James A Dudek
(74) *Attorney, Agent, or Firm* — JCIPRNET

(57) ABSTRACT

An active device substrate including a substrate, first metal grid wires, a first transparent conductive layer, a gate insulating layer, a semiconductor layer, a source, and a drain is provided. The first metal grid wires are located on the substrate. The first transparent conductive layer includes a scan line and a gate connected to the scan line. The scan line and/or the gate is directly connected to at least a part of the first metal grid wires. The gate insulating layer is located on the first transparent conductive layer. The semiconductor layer is located on the gate insulating layer and overlapped with the gate. The source and the drain are electrically connected to the semiconductor layer.

14 Claims, 14 Drawing Sheets

(51) Int. Cl.
*G02F 1/1368* (2006.01)
*H01L 27/12* (2006.01)
*H01L 29/786* (2006.01)

(52) U.S. Cl.
CPC ...... *G02F 1/136227* (2013.01); *H01L 27/124* (2013.01); *H01L 27/1288* (2013.01); *H01L 29/78633* (2013.01); *G02F 1/136218* (2021.01); *G02F 1/136295* (2021.01)

(58) Field of Classification Search
CPC ............. G02F 1/136295; H01L 27/124; H01L 27/1288; H01L 29/78633
See application file for complete search history.

(56) References Cited

U.S. PATENT DOCUMENTS

| | | | |
|---|---|---|---|
| 2001/0005598 A1* | 6/2001 | Powell | G02F 1/1368 438/30 |
| 2003/0111663 A1* | 6/2003 | Yagi | H01L 27/12 257/E29.147 |
| 2006/0192204 A1* | 8/2006 | Yamaguchi | H01L 27/124 257/E27.111 |
| 2006/0194500 A1* | 8/2006 | Ishii | H01L 27/124 445/24 |
| 2008/0093602 A1* | 4/2008 | Matsumura | H01L 29/4908 257/E27.113 |
| 2010/0171120 A1* | 7/2010 | Gosain | G06F 3/0421 438/34 |
| 2011/0086450 A1 | 4/2011 | Nam et al. | |
| 2017/0038640 A1 | 2/2017 | Wang | |
| 2018/0024399 A1* | 1/2018 | Han | G02F 1/133528 349/43 |

FOREIGN PATENT DOCUMENTS

| | | |
|---|---|---|
| CN | 107765481 | 3/2018 |
| CN | 108873501 | 11/2018 |

* cited by examiner

ACTIVE DEVICE SUBSTRATE AND METHOD FOR MANUFACTURING THE SAME

CROSS-REFERENCE TO RELATED APPLICATION

This application claims the priority benefit of Taiwan patent application serial no. 109103664, filed on Feb. 6, 2020. The entirety of the above-mentioned patent application is hereby incorporated by reference here and made a part of this specification.

BACKGROUND

Technical Field

The disclosure relates to an active device substrate, and in particular, to an active device substrate including a plurality of metal grid wires and a method for manufacturing the active device substrate.

Description of Related Art

In recent years, as display technologies have been in continuous progress, consumers have increasing requirements on display quality of a display. In order to manufacture a display with good performance, a display device needs to have sufficiently high image resolution. Generally, the number of pixels per unit area is required to be increased to increase the resolution of a liquid crystal display panel, and density of conductive wires in the liquid crystal display panel should also be increased to provide signals to the pixels. However, the conductive wires in a display area of the liquid crystal display panel may block light, so that an aperture ratio of the pixels decreases as the density of the conductive wires increases.

SUMMARY DISCLOSURE

The disclosure provides an active device substrate to reduce an impact of a scan line on an aperture ratio.

The disclosure provides a method for manufacturing an active device substrate to reduce an impact of a scan line on an aperture ratio.

At least one embodiment of the disclosure provides an active device substrate. The active device substrate includes a substrate, a plurality of first metal grid wires, a first transparent conductive layer, a gate insulating layer, a semiconductor layer, a source, and a drain. The first metal grid wires are located on the substrate. The first transparent conductive layer includes a scan line and a gate connected to the scan line. The scan line and/or the gate is directly connected to at least a part of the first metal grid wires. The gate insulating layer is located on the first transparent conductive layer. The semiconductor layer is located on the gate insulating layer and overlapped with the gate. The source and the drain are electrically connected to the semiconductor layer.

At least one embodiment of the disclosure provides a method for manufacturing an active device substrate. The method includes: forming a plurality of first metal grid wires on a substrate; forming an insulating pattern layer on the first metal grid wires; forming a first transparent material layer on the insulating pattern layer; patterning the first transparent material layer to form a first transparent conductive layer, the first transparent conductive layer including a scan line and a gate connected to the scan line; forming a gate insulating layer on the first transparent conductive layer; forming a semiconductor layer on the gate insulating layer, the semiconductor layer being overlapped with the gate; and forming a source and a drain on the semiconductor layer.

In one or more embodiments of the disclosure, the active device substrate and the method for forming the same are provided to increase the aperture ratio of the pixel.

In one or more embodiments of the disclosure, the active device substrate and the method for forming the same are provided to reduce impedance of the conductive wire.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
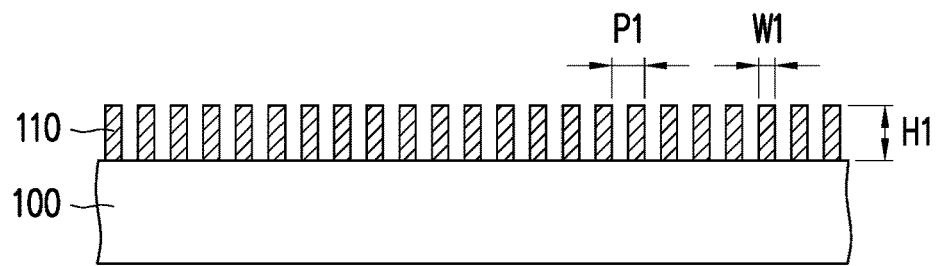
FIG. 1A to FIG. 1J are schematic cross-sectional diagrams of a method for manufacturing an active device substrate according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Directional terminology used in the embodiments, such as "top", "bottom", "front", "back", "left", "right", etc., is used with reference to the orientation of the figure(s) being described and are not intended to be limiting of the disclosure. In the drawings, general characteristics of methods, structures, and/or materials used in specific embodiments are illustrated. However, these drawings should not be construed to define or limit a scope or nature covered by these embodiments. For instance, for simplicity's sake, a relative size, thickness, and location of each film layer, region, and/or structure may be reduced or enlarged. It will be understood that when a component such as a layer, a film, a region, or a substrate is referred to be "on" or "connected to" another component, it may be directly on or connected to the other another component, or intermediate components may also exist there between. Comparatively, when a component is referred to be "directly on" or "directly connected" to another, none other intermediate component exits there between. As used herein, the "connection" may refer to physical and/or electrical connection. Furthermore, "electrical connection" or "coupling" of two components may refer to that other components may exist between the two components.

In the embodiments listed in the disclosure, the same or similar components be denoted by the same or similar reference numerals, and descriptions thereof will be omitted. In addition, the features in different embodiments may be combined with each other in case of no conflict, and simple equivalent changes and modifications made according to the specification or a scope of the patent application are still within a protection scope of the patent. Moreover, the terms "first" and "second" mentioned in the specification or the scope of the patent application are only used to name discrete components or to distinguish different embodiments or ranges, but are not used to limit an upper limit or a lower limit of an amount of the components, and are also not used to limit a manufacturing sequence or a setting sequence of the components.

"About", "approximate", or "substantial" used in the specification includes a stated value and an average value within an acceptable deviation range from a specific value determined by those with ordinary skills in the art while considering the discussed measurement and a specific number of errors associated with the measurement (i.e. limits of a measurement system). For instance, "about" may represent to be within one or more standard deviations of the stated value, or within ±30%, ±20%, ±10%, and ±5%. Moreover, an acceptable deviation range or standard deviation may be selected for the "about", "approximate" or "substantial" used in the specification based on optical properties, etching properties, or other properties without using one standard deviation for all properties.

FIG. 1A to FIG. 1J are schematic cross-sectional diagrams of a method for manufacturing an active device substrate 10 according to an embodiment of the disclosure.

With reference to FIG. 1A, a plurality of first metal grid wires 110 are formed on a substrate 100. In the present embodiment, a method for forming the first metal grid wires 110 includes: forming a metal material layer on the substrate 100, and forming a patterned photoresist on the metal material layer by using a nano-imprint lithography (NIL) technology, and finally etching the metal material layer by using the patterned photoresist as a mask to form a plurality of the first metal grid wires 110, but the disclosure is not limited thereto. The first metal grid wires 110 may be further formed in other suitable methods. In the present embodiment, the first metal grid wires 110 are made of gold, silver, copper, aluminum, molybdenum, titanium, tantalum, other metals, or an alloy of the metals. In some embodiments, the first metal grid wires 110 are a single layer of metal, multiple layers of metal, or a stacked layer of metal and other materials.

In the present embodiment, a width W1 of each of the first metal grid wires 110 is 25 nm to 150 nm, a height H1 of each of the first metal grid wires 110 is 50 nm to 500 nm, and a pitch P1 of each of the first metal grid wires 110 is 50 nm to 300 nm. In the present embodiment, the first metal grid wires 110 may be, for example, a metal wire grid polarizer (WGP).

Figure 1B:
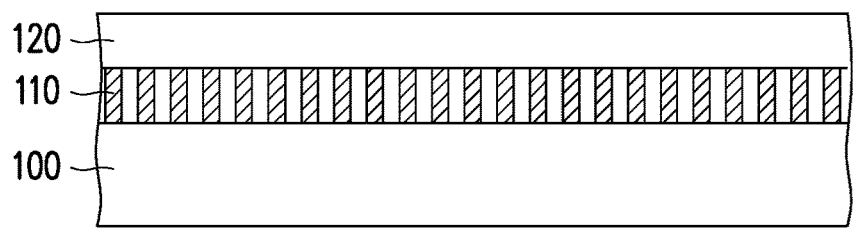

With reference to FIG. 1B, an insulating material layer 120 is formed on the first metal grid wires 110. The insulating material layer 120 is an inorganic material or an organic material. In some embodiments, the insulating material layer 120 includes, for example, silicon oxide, silicon nitride, silicon oxynitride, or other suitable materials. In the present embodiment, the insulating material layer 120 is not filled in a gap between the first metal grid wires 110, but the disclosure is not limited thereto. In other embodiments, a part of the insulating material layer 120 is filled in the gap between the first metal grid wires 110.

Figure 1C:
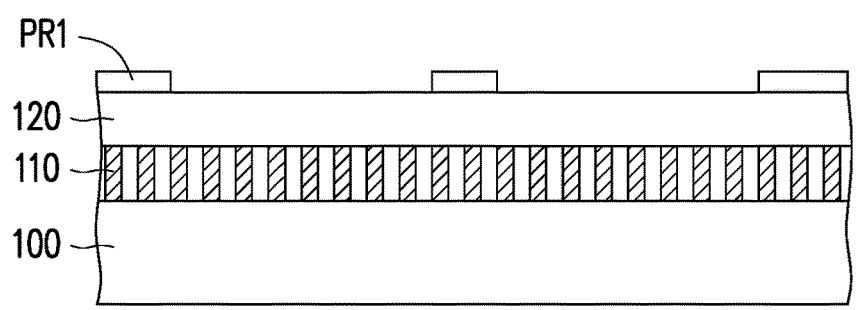

With reference to FIG. 1C, a photoresist pattern PR1 is formed on the insulating material layer 120. The photoresist pattern PR1 exposes a part of the insulating material layer 120.

Figure 1D:
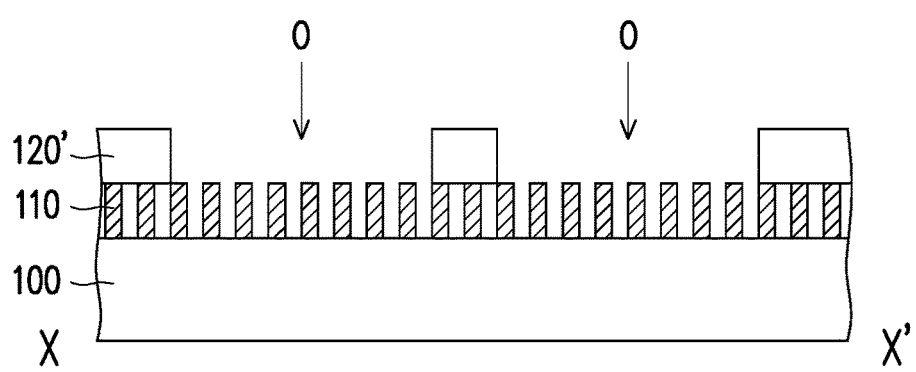
Figure 2A:
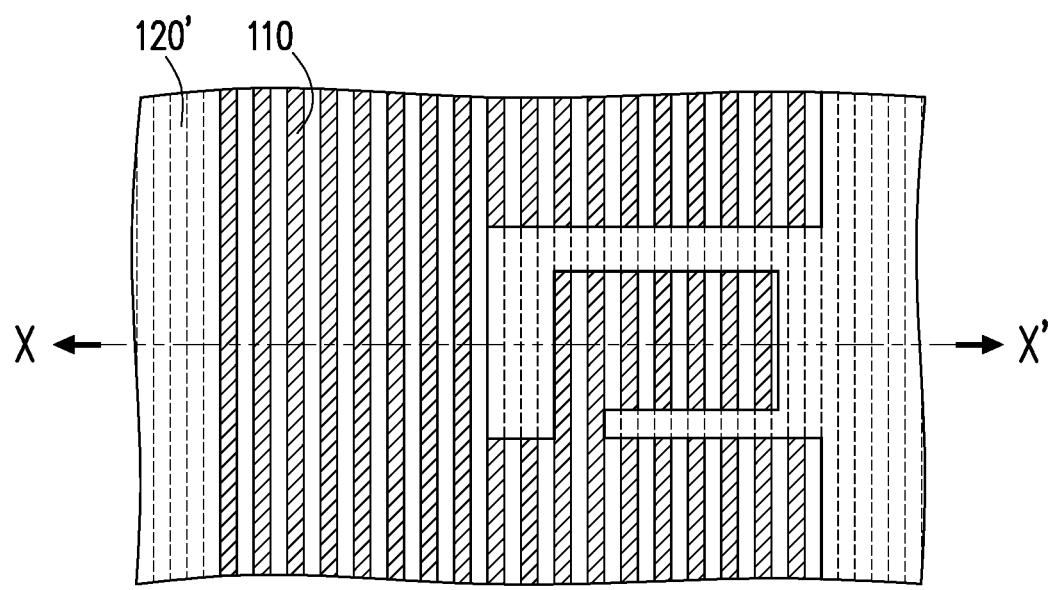
FIG. 2A to FIG. 2C are schematic top diagrams of a method for manufacturing an active device substrate according to an embodiment of the disclosure.

FIG. 1D is a schematic cross-sectional diagram taken along a line XX' in FIG. 2A. With reference to both FIG. 1D and FIG. 2A, the insulating material layer 120 is patterned by using the photoresist pattern PR1 as a mask to form an insulating pattern layer 120' exposing at least a part of the first metal grid wires 110. After the insulating pattern layer 120' is formed, the photoresist pattern PR1 is removed.

In the present embodiment, the insulating pattern layer 120' includes a through hole O, at least a part of the first metal grid wires 110 being located under the through hole O.

Figure 1E:
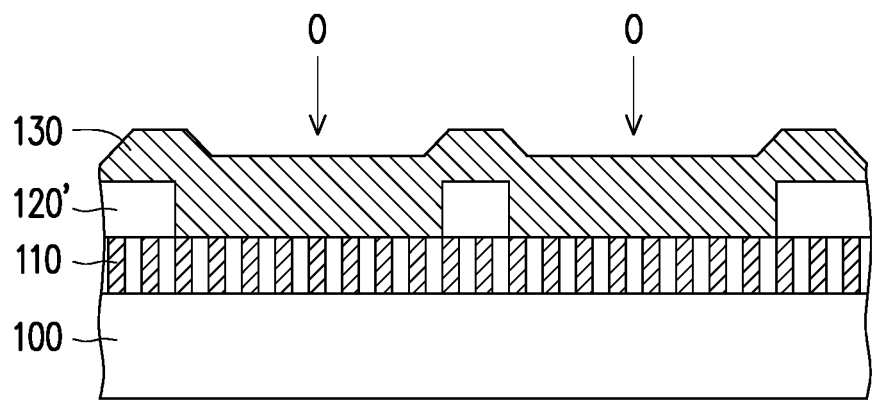

With reference to FIG. 1E, a first transparent material layer 130 is formed on the insulating pattern layer 120'. The first transparent material layer 130 is a metal oxide, such as an indium tin oxide, an indium zinc oxide, or other suitable materials.

In the present embodiment, the first transparent material layer 130 is formed on a top surface of the insulating pattern layer 120' and in the through hole O of the insulating pattern layer 120'.

Figure 1F:
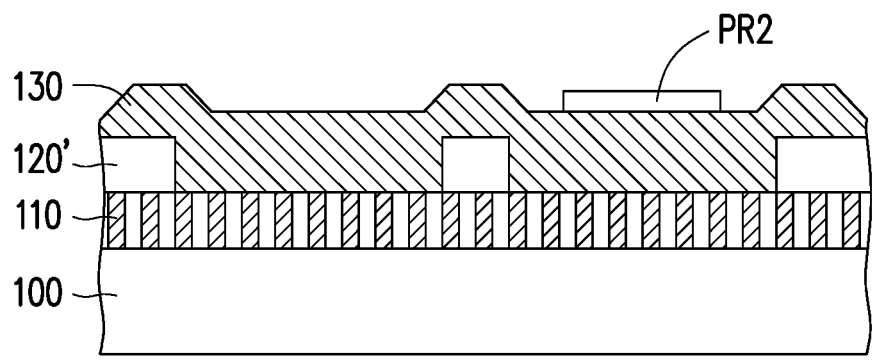

With reference to FIG. 1F, a photoresist pattern PR2 is formed on the first transparent material layer 130. The photoresist pattern PR2 is for example, located at a position of the first transparent material layer 130 corresponding to a gate (drawn in FIG. 1G).

Figure 1G:
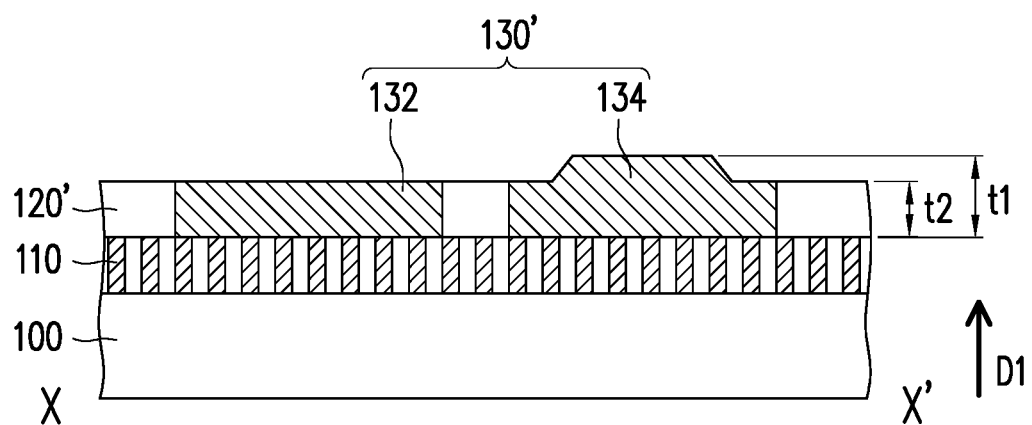
Figure 2B:
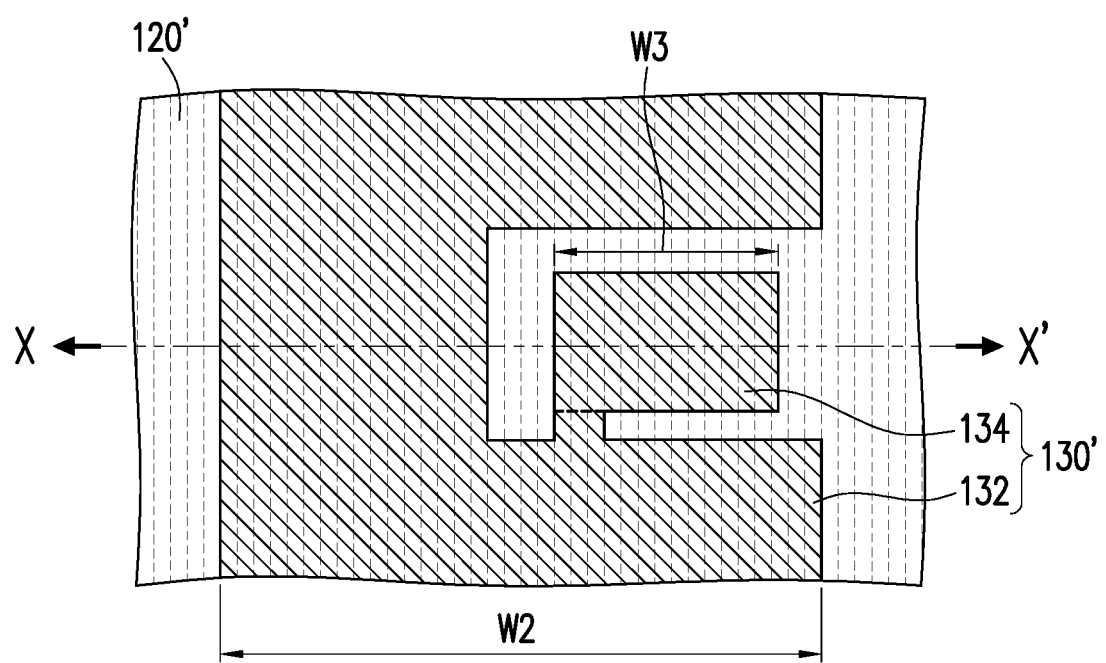

FIG. 1G is a schematic cross-sectional diagram taken along a line XX' in FIG. 2B. With reference to FIG. 1G and FIG. 2B, the first transparent material layer 130 is patterned to form a first transparent conductive layer 130'. In the present embodiment, the first transparent material layer 130 is etched by using the photoresist pattern PR2 as a mask. A part of the first transparent material layer 130 overlapped with the insulating pattern layer 120' in a direction D1 perpendicular to the substrate 100 is removed after being etched, and the top surface of the insulating pattern layer 120' is exposed. In other words, a part of the first transparent material layer 130 contacting the top surface of the insulating pattern layer 120' is removed after being etched.

The first transparent conductive layer 130' includes a scan line 132 and a gate 134 connected to the scan line 132. In the present embodiment, a side of the gate 134 is directly connected to the scan line 132. In the present embodiment, because a position of the gate 134 corresponds to the photoresist pattern PR2, a thickness t1 of the gate 134 is greater than a thickness t2 of the scan line 132. That the thickness t1 of the gate 134 is greater than the thickness t2 of the scan line 132 may reduce an impact of light on a semiconductor layer (drawn in FIG. 1I) of an active device, thereby reducing optical leakage.

In the present embodiment, the thickness t2 of the scan line 132 is greater than or equal to 50 nm, for example, the thickness t2 is 100 nm. The thickness t1 of the gate 134 is greater than or equal to 50 nm. In the present embodiment, a width W3 of the gate 134 is greater than or equal to 1 for example, the width W3 is 1 µm to 100 µm. A width W2 of the scan line 132 is greater than or equal to 1 for example, the width W2 is 1 µm to 100 µm.

The scan line 132 and/or the gate 134 are directly connected to at least a part of the first metal grid wires 110. Therefore, even if the scan line 132 and/or the gate 134 is made of a metal oxide with higher impedance than that of a metal, impedance may be reduced by using the first metal grid wires 110. In some embodiments, impedance of a conductive wire may be reduced by increasing a height of the first metal grid wires 110.

The scan line 132 and the gate 134 are overlapped with 10 or more of the first metal grid wires 110. For example, the scan line 132 and the gate 134 are overlapped with 10 to 1000 of the first metal grid wires 110.

Figure 1H:
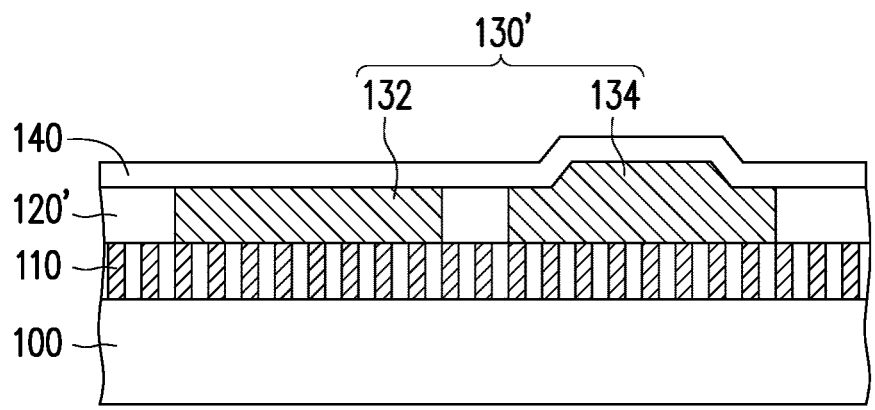

With reference to FIG. 1H, a gate insulating layer 140 is formed on the first transparent conductive layer 130'. In the present embodiment, the gate insulating layer 140 covers the insulating pattern layer 120', the scan line 132, and the gate 134. The gate insulating layer 140 is an inorganic material or an organic material. In some embodiments, the gate insulating layer 140 includes, for example, silicon oxide, silicon nitride, silicon oxynitride, or other suitable materials. In some embodiments, the gate insulating layer 140 and the insulating pattern layer 120' include a same material.

Figure 1I:
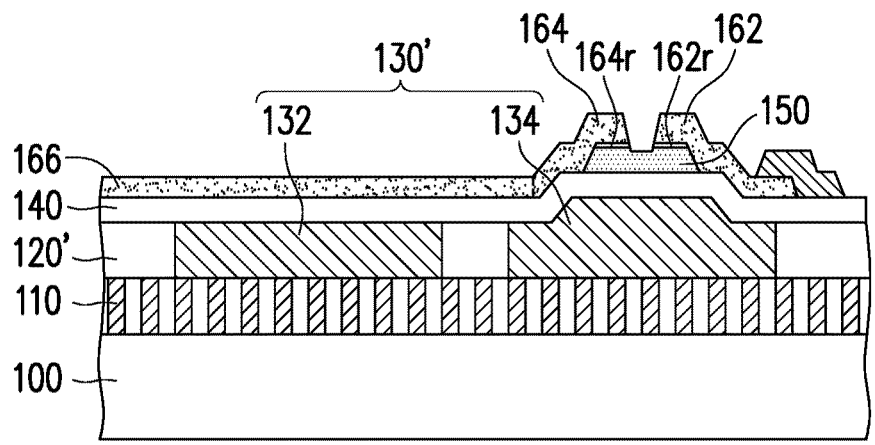

With reference to FIG. 1I, a semiconductor layer 150 is formed on the gate insulating layer 140, and the semiconductor layer 150 is overlapped with the gate 134 in a direction D1 perpendicular to the substrate 100. In the present embodiment, the semiconductor layer 150 includes, for example, amorphous silicon, polycrystalline silicon, microcrystalline silicon, single crystal silicon, an organic semiconductor material, an oxide semiconductor material (for example, an indium zinc oxide, a indium gallium zinc oxide, or other suitable materials, or a combination thereof), other suitable materials, or a combination of thereof. In some embodiments, the semiconductor layer 150 includes a dopant.

A source 162 and a drain 164 are formed on the semiconductor layer 150. A pixel electrode 166 is formed on the gate insulating layer 140. In the present embodiment, the source 162, the drain 164, and the pixel electrode 166 are transparent conductive materials, such as an indium tin oxide or an indium zinc oxide. In the present embodiment, the source 162, the drain 164, and the pixel electrode 166 belong to a same transparent conductive layer. A method for forming the source 162, the drain 164, and the pixel electrode 166 includes: for example, forming a transparent conductive material on the semiconductor layer 150, and then patterning the transparent conductive material to form the source 162, the drain 164, and the pixel electrode 166. The source 162 and the drain 164 are separated from each other, and the pixel electrode 166 is connected to the drain 164. In some embodiments, when the transparent conductive material is patterned, a part of the semiconductor layer 150 between the source 162 and the drain 164 is also etched, so that a groove is generated in the part of the semiconductor layer 150 between the source 162 and the drain 164, but the disclosure is not limited thereto. In some embodiments, ohmic contact layers 162r and 164r may be further optionally included between the source 162 and the semiconductor layer 150 and between the drain 164 and the semiconductor layer 150, but the disclosure is not limited thereto.

In the present embodiment, the first metal grid wires 110 are overlapped with the source 162, the drain 164, the pixel electrode 166, the scan line 132, and the gate 134. In the present embodiment, the pixel electrode 166 is overlapped with the scan line 132.

Figure 1J:
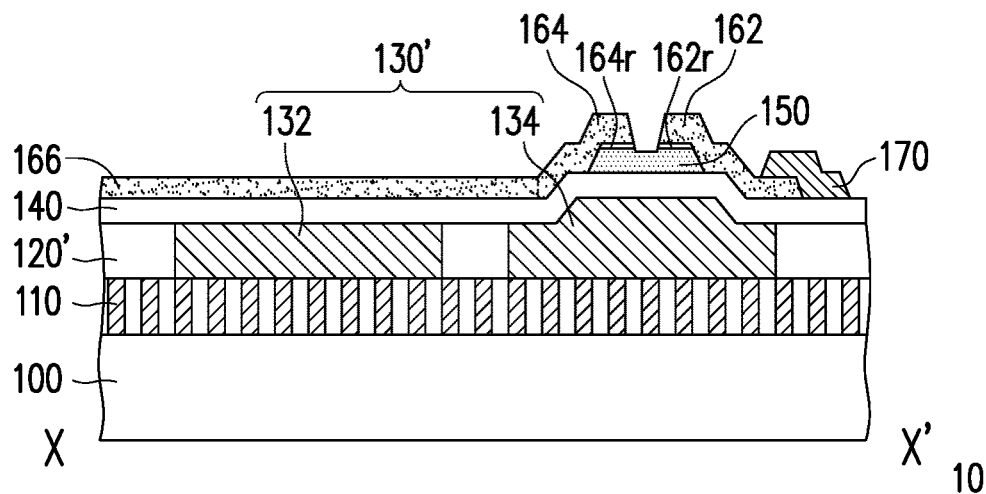
Figure 2C:
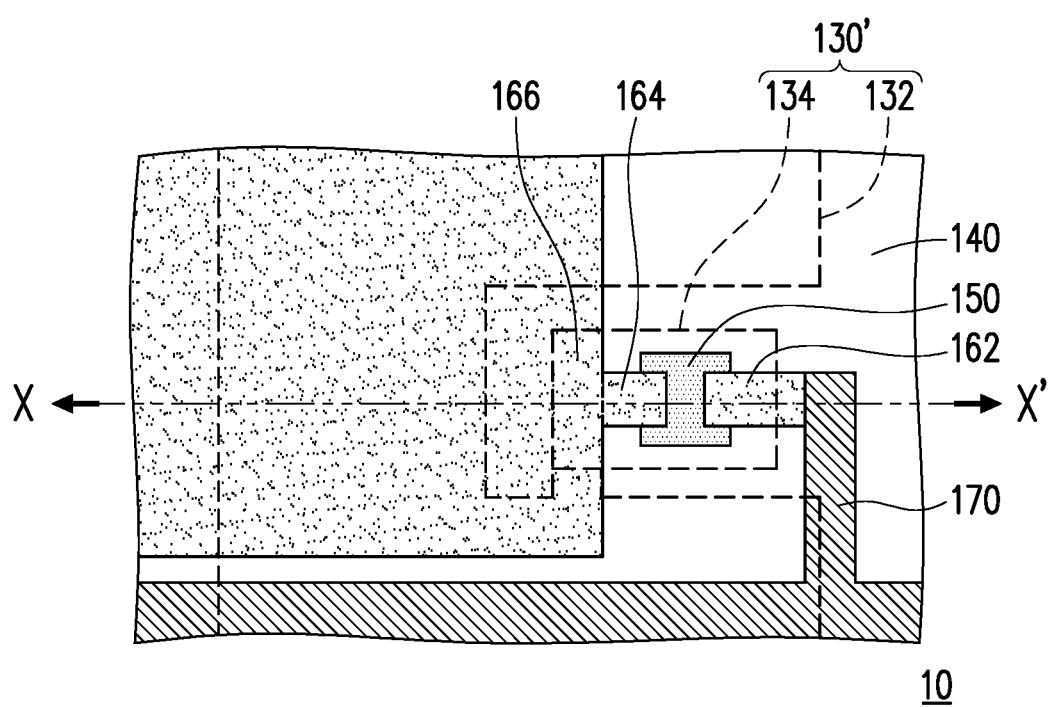

FIG. 1J is a schematic cross-sectional diagram taken along a line XX' in FIG. 2C. For convenience of description, the first metal grid wires 110 are omitted in FIG. 2C. With reference to FIG. 1J and FIG. 2C, a data line 170 is formed on the source 162 and the gate insulating layer 140. The data line 170 is separated from the drain 164 and the pixel electrode 166. A direction in which the data line 170 is extended is different from a direction in which the scan line 132 is extended. In the present embodiment, the data line 170 is directly formed on the source 162, but the disclosure is not limited thereto.

The data line 170 is a transparent or non-transparent conductive material. In the present embodiment, the data line 170 includes a metal.

Based on the foregoing, the first transparent conductive layer 130' is directly connected to at least a part of the first metal grid wires 110. Therefore, impedance of the first transparent conductive layer 130' may be reduced by using the first metal grid wires 110. In addition, because the scan line 132 includes a transparent conductive material, an impact of the scan line 132 on an aperture ratio may be reduced.

Figure 3:
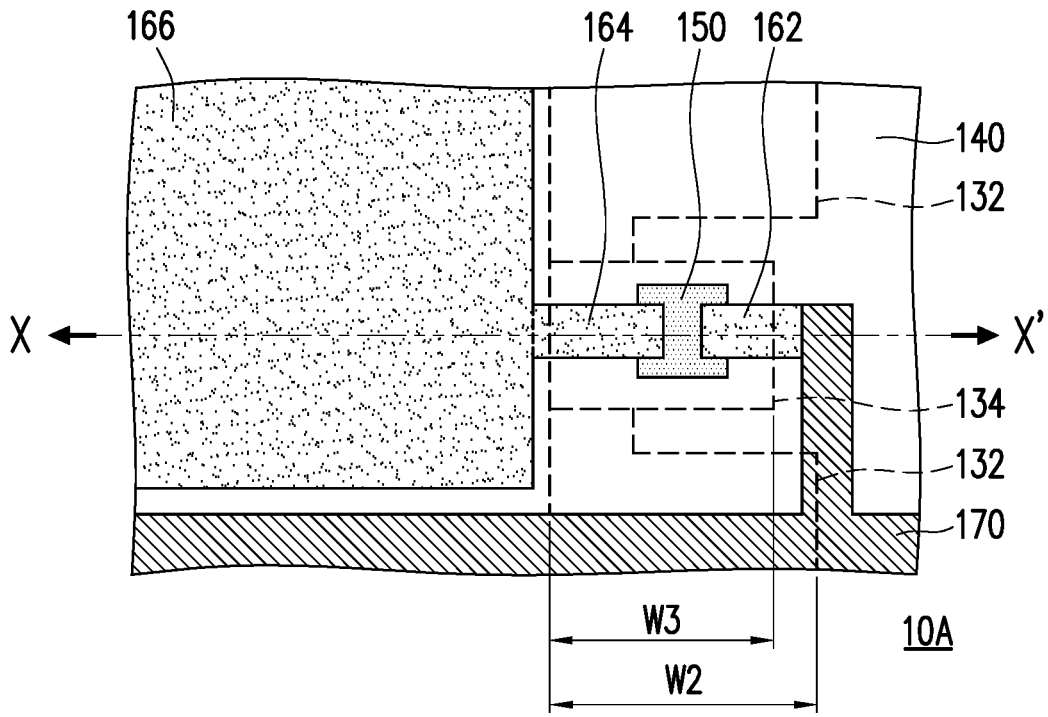
FIG. 3 is a schematic top diagram of an active device substrate according to an embodiment of the disclosure.
Figure 4:
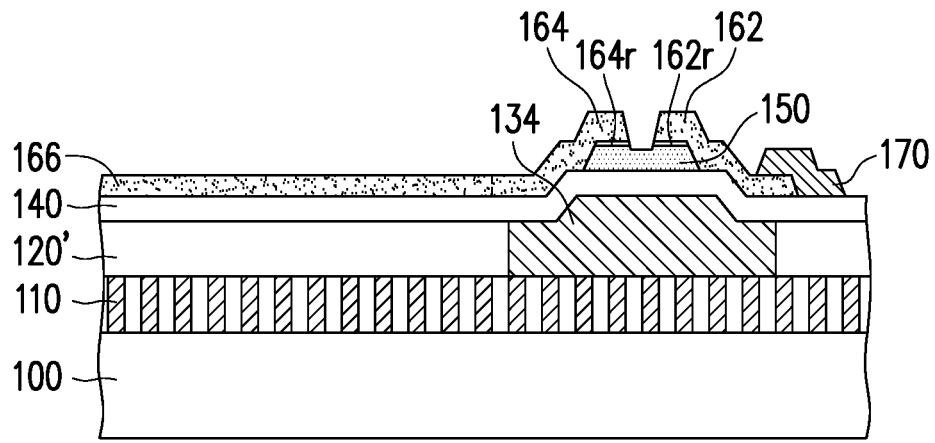
FIG. 4 is a schematic cross-sectional diagram taken along a line XX' in FIG. 3.

FIG. 3 is a schematic top diagram of an active device substrate according to an embodiment of the disclosure. FIG. 4 is a schematic cross-sectional diagram taken along a line XX' in FIG. 3. For convenience of description, the first metal grid wires 110 are omitted in FIG. 3.

It should be noted herein that, in embodiments provided in FIG. 3 and FIG. 4, element numerals and partial content of the embodiments provided in FIG. 1A to FIG. 1J are followed, the same or similar reference numerals being used to represent the same or similar elements, and description of the same technical content being omitted. For a description of an omitted part, reference may be made to the foregoing embodiment, and the descriptions thereof are omitted herein.

A main difference between an active device substrate 10A in FIG. 3 and the active device substrate 10 in FIG. 1J is shown below: a scan line 132 of the active device substrate 10A has a small width.

With reference to both FIG. 3 and FIG. 4, the first transparent conductive layer 130' includes the scan line 132 and a gate 134 connected to the scan line 132. In the present embodiment, two sides of the gate 134 are directly connected to the scan line 132.

In the present embodiment, a width W3 of the gate 134 is greater than or equal to 1 µm, for example, the width W3 is 1 µm to 100 µm. A width W2 of the scan line 132 is greater than or equal to 1 µm, for example, the width W2 is 1 µm to 100 µm. The scan line 132 and the gate 134 are overlapped with 10 or more of the first metal grid wires 110. For example, the scan line 132 and the gate 134 are overlapped with 10 to 1000 of the first metal grid wires 110.

Based on the foregoing, the first transparent conductive layer 130' is directly connected to at least a part of the first metal grid wires 110. Therefore, impedance of the first transparent conductive layer 130' may be reduced by using the first metal grid wires 110. In addition, because the scan line 132 includes a transparent conductive material, an impact of the scan line 134 on an aperture ratio may be reduced.

Figure 5:
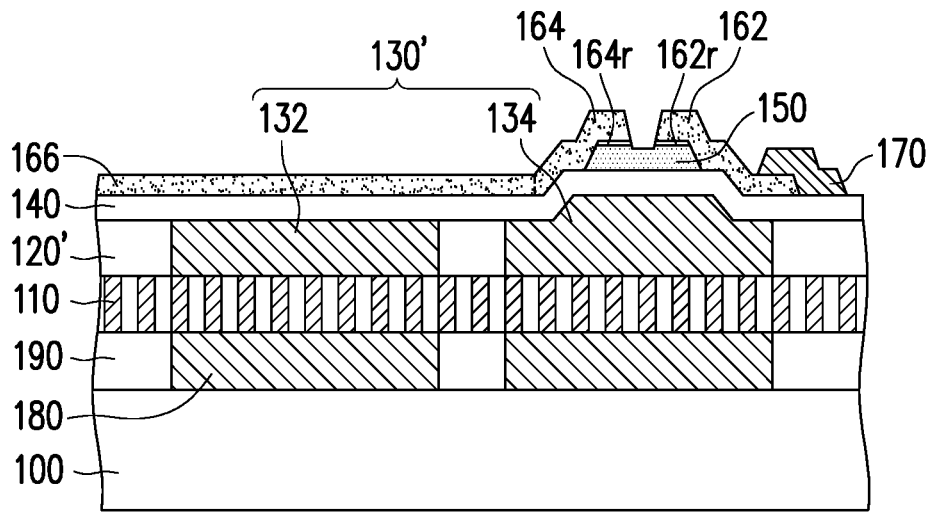
FIG. 5 is a schematic cross-sectional diagram of an active device substrate according to an embodiment of the disclosure.

FIG. 5 is a schematic cross-sectional diagram of an active device substrate according to an embodiment of the disclosure. It should be noted herein that, in the embodiment provided in FIG. 5, element numerals and partial content of the embodiments provided in FIG. 1A to FIG. 1J are followed, the same or similar reference numerals being used to represent the same or similar elements, and description of the same technical content being omitted. For a description of an omitted part, reference may be made to the foregoing embodiment, and the descriptions thereof are omitted herein.

A main difference between an active device substrate 10B in FIG. 5 and the active device substrate 10 in FIG. 1J is shown below: the active device substrate 10B further includes a second transparent conductive layer 180.

The second transparent conductive layer 180 has a same pattern as the first transparent conductive layer 130'. The first metal grid wires 110 are located between the first transparent conductive layer 130' and the second transparent conductive layer 180.

In the present embodiment, the active device substrate 10B further includes an insulating layer 190. The insulating layer 190 is located on the substrate 100, and the second transparent conductive layer 180 is located in a through hole of the insulating layer 190.

Based on the foregoing, impedance of the scan line may be further reduced by disposing of the second transparent conductive layer 180.

Figure 6:
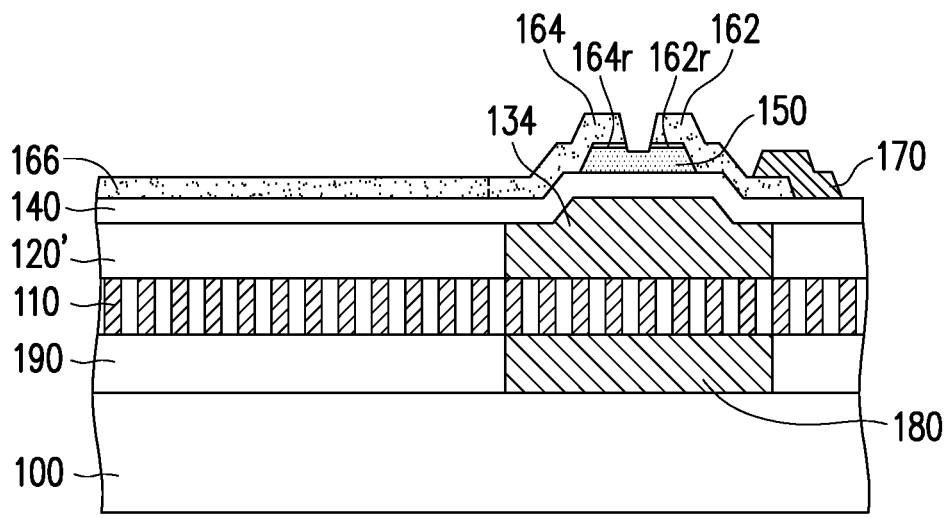
FIG. 6 is a schematic cross-sectional diagram of an active device substrate according to an embodiment of the disclosure.

FIG. 6 is a schematic cross-sectional diagram of an active device substrate according to an embodiment of the disclosure. It should be noted herein that, in the embodiment provided in FIG. 6, element numerals and partial content of the embodiment provided in FIG. 4 are followed, the same or similar reference numerals being used to represent the same or similar elements, and description of the same technical content being omitted. For a description of an omitted part, reference may be made to the foregoing embodiment, and the descriptions thereof are omitted herein.

A main difference between an active device substrate 10C in FIG. 6 and the active device substrate 10A in FIG. 4 is shown below: the active device substrate 10C further includes a second transparent conductive layer 180.

The second transparent conductive layer 180 has a same pattern as the first transparent conductive layer 130'. The first metal grid wires 110 are located between the first transparent conductive layer 130' and the second transparent conductive layer 180.

In the present embodiment, the active device substrate 10C further includes an insulating layer 190. The insulating layer 190 is located on the substrate 100, and the second transparent conductive layer 180 is located in a through hole of the insulating layer 190.

Based on the foregoing, impedance of the scan line may be further reduced by disposing of the second transparent conductive layer 180.

Figure 7:
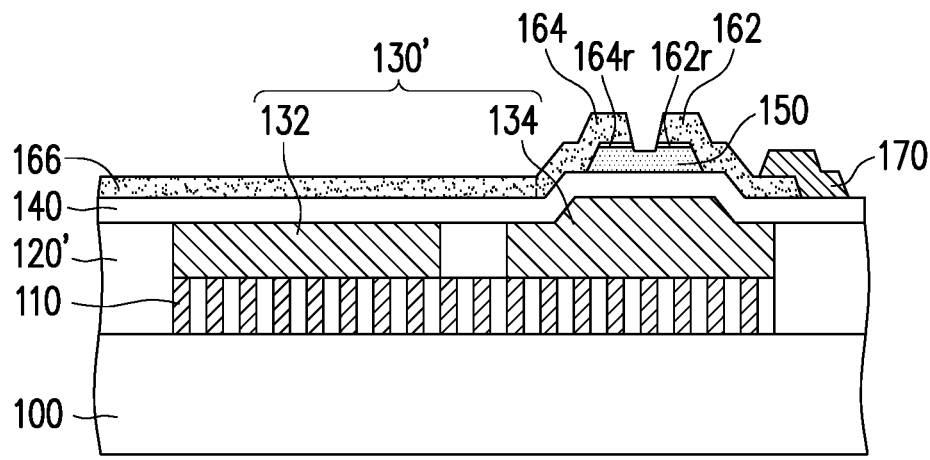
FIG. 7 is a schematic cross-sectional diagram of an active device substrate according to an embodiment of the disclosure.

FIG. 7 is a schematic cross-sectional diagram of an active device substrate according to an embodiment of the disclosure. It should be noted herein that, in the embodiment provided in FIG. 7, element numerals and partial content of the embodiments provided in FIG. 1A to FIG. 1J are followed, the same or similar reference numerals being used to represent the same or similar elements, and description of the same technical content being omitted. For a description of an omitted part, reference may be made to the foregoing embodiment, and the descriptions thereof are omitted herein.

A main difference between an active device substrate 10D in FIG. 7 and the active device substrate 10 in FIG. 1J is shown below: the first metal grid wires 110 of the active device substrate 10D are only disposed at a position of a drive circuit (including a scan line 132 and a gate 134).

In the present embodiment, an orthogonal projection area of the first metal grid wire 110 on the substrate 100 is smaller than an orthogonal projection area of the first transparent conductive layer 130' on the substrate 100. Although an insulating pattern layer 120' is shown as a single-layer structure in FIG. 7, the disclosure is not limited thereto. In some embodiments, the insulating pattern layer 120' may have a multilayer structure.

Based on the foregoing, the first transparent conductive layer 130' is directly connected to at least a part of the first metal grid wires 110. Therefore, impedance of the first transparent conductive layer 130' may be reduced by using the first metal grid wires 110. In addition, because the scan line 132 includes a transparent conductive material, an impact of the scan line 134 on an aperture ratio may be reduced.

Figure 8:
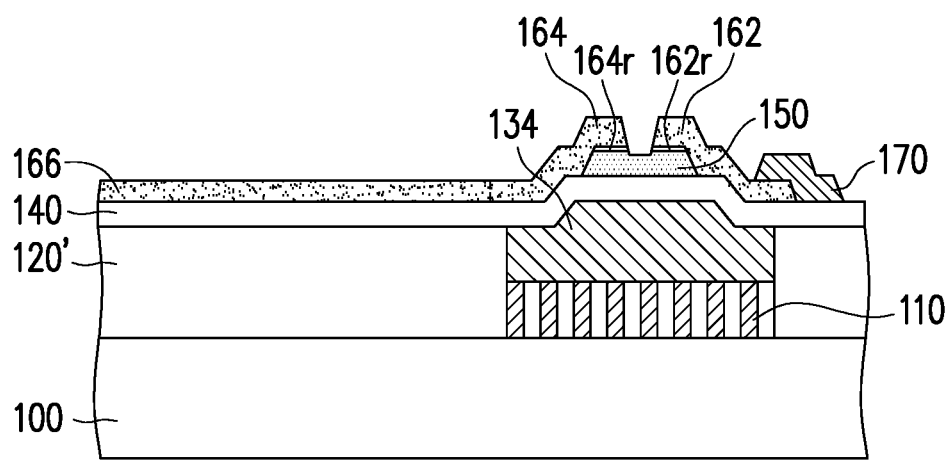
FIG. 8 is a schematic cross-sectional diagram of an active device substrate according to an embodiment of the disclosure.

FIG. 8 is a schematic cross-sectional diagram of an active device substrate according to an embodiment of the disclosure. It should be noted herein that, in the embodiment provided in FIG. 8, element numerals and partial content of the embodiment provided in FIG. 4 are followed, the same or similar reference numerals being used to represent the same or similar elements, and description of the same technical content being omitted. For a description of an omitted part, reference may be made to the foregoing embodiment, and the descriptions thereof are omitted herein.

A main difference between an active device substrate 10E in FIG. 8 and the active device substrate 10A in FIG. 4 is shown below: first metal grid wires 110 of the active device substrate 10E are only disposed at a position of a drive circuit (including a scan line 132 and a gate 134).

In the present embodiment, an orthogonal projection area of the first metal grid wire 110 on the substrate 100 is smaller than an orthogonal projection area of the first transparent conductive layer 130' on the substrate 100. Although an insulating pattern layer 120' is shown as a single-layer structure in FIG. 8, the disclosure is not limited thereto. In some embodiments, the insulating pattern layer 120' may have a multilayer structure.

Based on the foregoing, the first transparent conductive layer 130' is directly connected to at least a part of the first metal grid wires 110. Therefore, impedance of the first transparent conductive layer 130' may be reduced by using the first metal grid wires 110. In addition, because the scan line 132 includes a transparent conductive material, an impact of the scan line 134 on an aperture ratio may be reduced.

Figure 9:
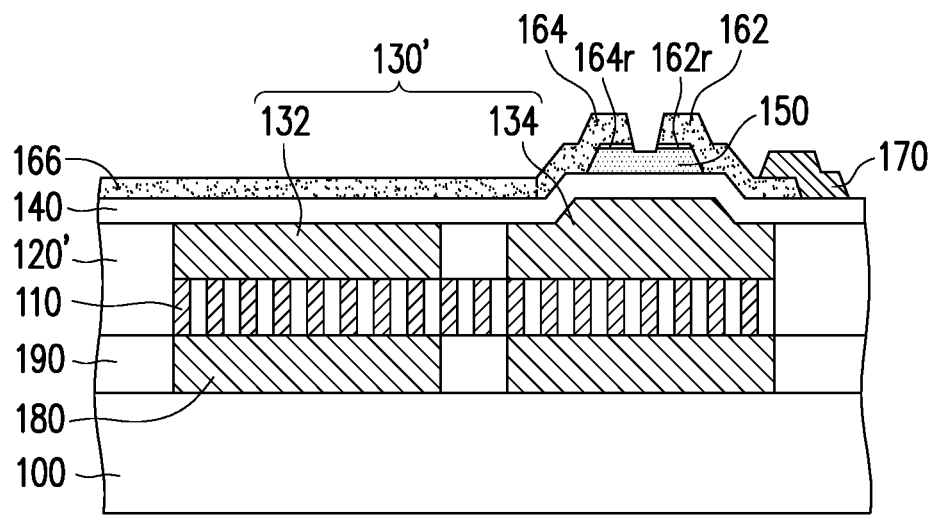
FIG. 9 is a schematic cross-sectional diagram of an active device substrate according to an embodiment of the disclosure.

FIG. 9 is a schematic cross-sectional diagram of an active device substrate according to an embodiment of the disclosure. It should be noted herein that, in the embodiment provided in FIG. 9, element numerals and partial content of the embodiment provided in FIG. 7 are followed, the same or similar reference numerals being used to represent the same or similar elements, and description of the same technical content being omitted. For a description of an omitted part, reference may be made to the foregoing embodiment, and the descriptions thereof are omitted herein.

A main difference between an active device substrate 10F in FIG. 9 and the active device substrate 10D in FIG. 7 is shown below: the active device substrate 10F further includes a second transparent conductive layer 180.

The second transparent conductive layer 180 has a same pattern as the first transparent conductive layer 130'. The first metal grid wires 110 are located between the first transparent conductive layer 130' and the second transparent conductive layer 180.

In the present embodiment, the active device substrate 10F further includes an insulating layer 190. The insulating layer 190 is located on the substrate 100, and the second transparent conductive layer 180 is located in a through hole of the insulating layer 190.

Based on the foregoing, impedance of the scan line may be further reduced by disposing of the second transparent conductive layer 180.

Figure 10:
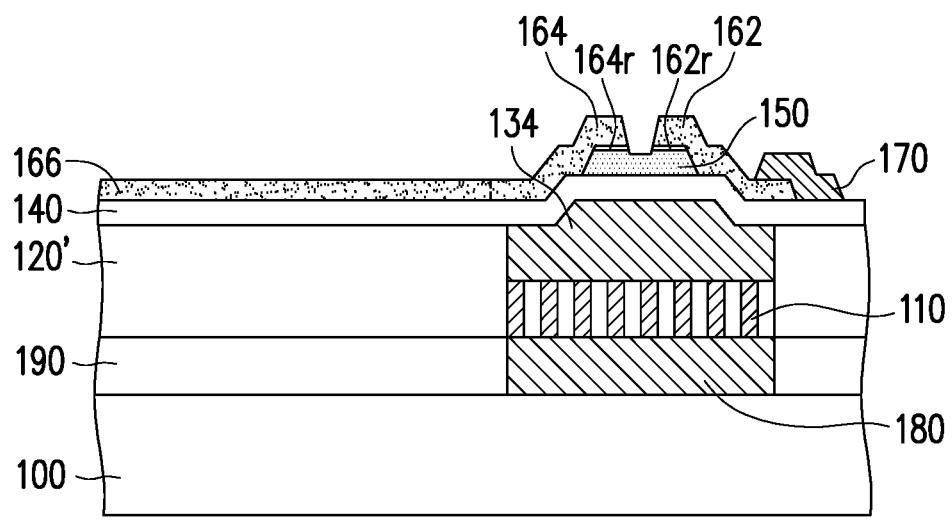
FIG. 10 is a schematic cross-sectional diagram of an active device substrate according to an embodiment of the disclosure.

FIG. 10 is a schematic cross-sectional diagram of an active device substrate according to an embodiment of the disclosure. It should be noted herein that, in the embodiment provided in FIG. 10, element numerals and partial content of the embodiment provided in FIG. 8 are followed, the same or similar reference numerals being used to represent the same or similar elements, and description of the same technical content being omitted. For a description of an omitted part, reference may be made to the foregoing embodiment, and the descriptions thereof are omitted herein.

A main difference between an active device substrate 10G in FIG. 10 and the active device substrate 10E in FIG. 8 are shown below: the active device substrate 10G further includes a second transparent conductive layer 180.

The second transparent conductive layer 180 has a same pattern as the first transparent conductive layer 130'. The first metal grid wires 110 are located between the first transparent conductive layer 130' and the second transparent conductive layer 180.

In the present embodiment, the active device substrate 10G further includes an insulating layer 190. The insulating layer 190 is located on the substrate 100, and the second transparent conductive layer 180 is located in a through hole of the insulating layer 190.

Based on the foregoing, impedance of the scan line may be further reduced by disposing of the second transparent conductive layer 180.

Figure 11:
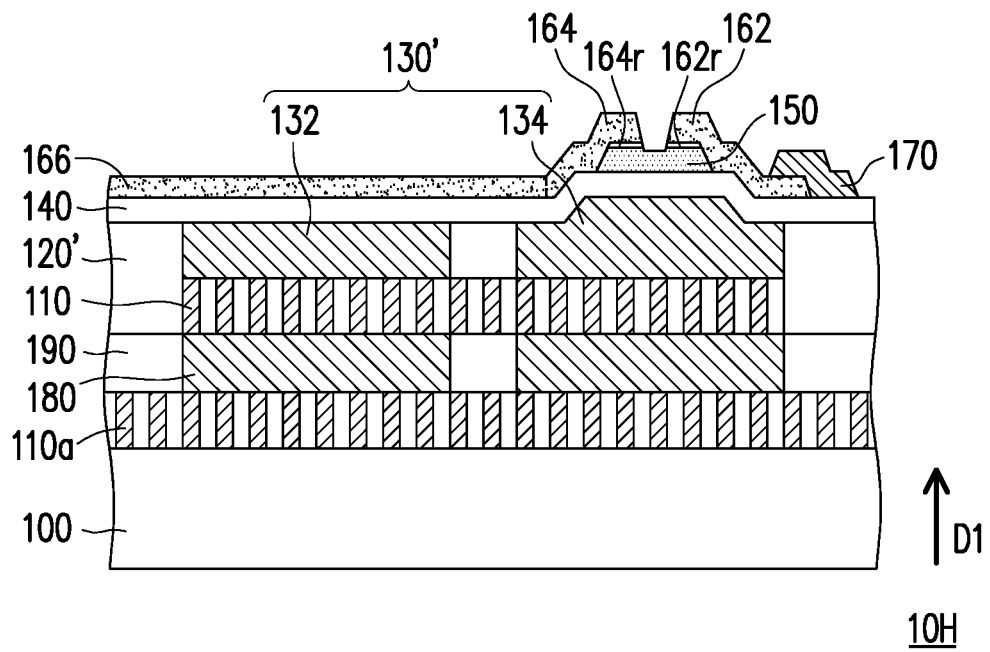
FIG. 11 is a schematic cross-sectional diagram of an active device substrate according to an embodiment of the disclosure.

FIG. 11 is a schematic cross-sectional diagram of an active device substrate according to an embodiment of the disclosure. It should be noted herein that, in the embodiment provided in FIG. 11, element numerals and partial content of the embodiment provided in FIG. 9 are followed, the same or similar reference numerals being used to represent the same or similar elements, and description of the same technical content being omitted. For a description of an omitted part, reference may be made to the foregoing embodiment, and the descriptions thereof are omitted herein.

A main difference between an active device substrate 10H in FIG. 11 and the active device substrate 10F in FIG. 9 is shown below: the active device substrate 10H further includes a plurality of second metal grid wires 110a.

With reference to FIG. 11, the second metal grid wires 110a are located on a substrate 100. A second transparent conductive layer 180 is located between the second metal grid wires 110a and the first metal grid wires 110.

In the present embodiment, the first metal grid wires 110 are only disposed at a position of a drive circuit (including a scan line 132 and a gate 134), and the second metal grid wires 110a are further disposed at an opening area of a pixel in addition to the position of the drive circuit.

In some embodiments, a width of each of the first metal grid wires 110 is the same as or different from a width of each of the second metal grid wires 110a. In some embodiments, a height of each of the first metal grid wires 110 is the same as or different from a height of each of the second metal grid wires 110a. In some embodiments, a pitch of each of the first metal grid wires 110 is the same as or different from a pitch of each of the second metal grid wires 110a. In the present embodiment, the first metal grid wires 110 are overlapped with the second metal grid wires 110a in a direction D1 perpendicular to the substrate 100.

In the present embodiment, the second metal grid wires 110a may be, for example, a metal wire grid polarizer (WGP).

Based on the foregoing, the first transparent conductive layer 130' is directly connected to at least a part of the first metal grid wires 110. Therefore, impedance of the first transparent conductive layer 130' may be reduced by using the first metal grid wires 110. In addition, because the scan line 132 includes a transparent conductive material, an impact of the scan line 134 on an aperture ratio may be reduced.

Figure 12:
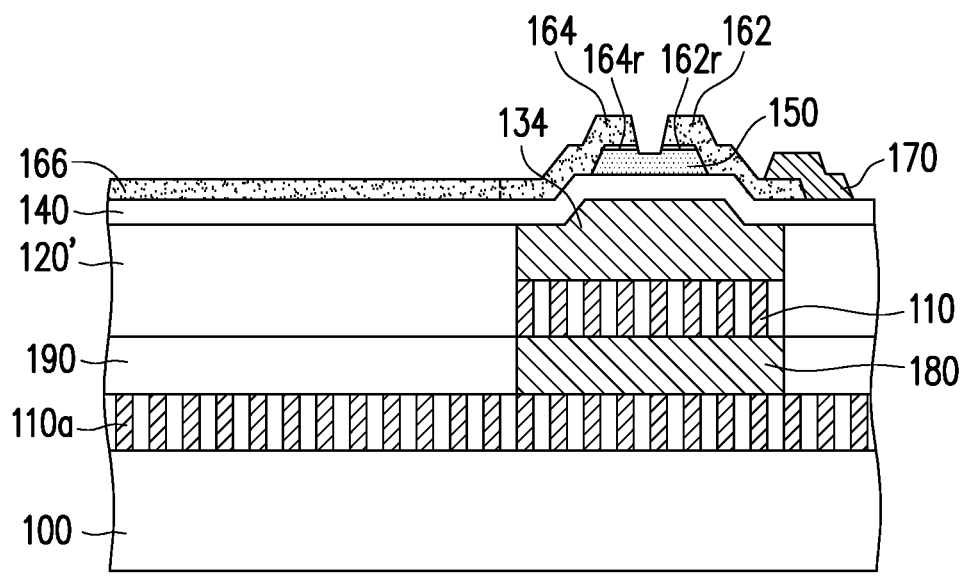
FIG. 12 is a schematic cross-sectional diagram of an active device substrate according to an embodiment of the disclosure.

FIG. 12 is a schematic cross-sectional diagram of an active device substrate according to an embodiment of the disclosure. It should be noted herein that, in the embodiment provided in FIG. 12, element numerals and partial content of the embodiment provided in FIG. 4 are followed, the same or similar reference numerals being used to represent the same or similar elements, and description of the same technical content being omitted. For a description of an omitted part, reference may be made to the foregoing embodiment, and the descriptions thereof are omitted herein.

A main difference between an active device substrate 10I in FIG. 12 and the active device substrate 10G in FIG. 10 is shown below: the active device substrate 10I further includes a plurality of second metal grid wires 110a.

In some embodiments, a width of each of the first metal grid wires 110 is the same as or different from a width of each of the second metal grid wires 110a. In some embodiments, a height of each of the first metal grid wires 110 is the same as or different from a height of each of the second metal grid wires 110a. In some embodiments, a pitch of each of the first metal grid wires 110 is the same as or different from a pitch of each of the second metal grid wires 110a. In the present embodiment, the first metal grid wires 110 are overlapped with the second metal grid wires 110a in a direction D1 perpendicular to the substrate 100.

In the present embodiment, the second metal grid wires 110a may be, for example, a metal wire grid polarizer (WGP).

Based on the foregoing, the first transparent conductive layer 130' is directly connected to at least a part of the first metal grid wires 110. Therefore, impedance of the first transparent conductive layer 130' may be reduced by using the first metal grid wires 110. In addition, because the scan line 132 includes a transparent conductive material, an impact of the scan line 134 on an aperture ratio may be reduced.

Figure 13:
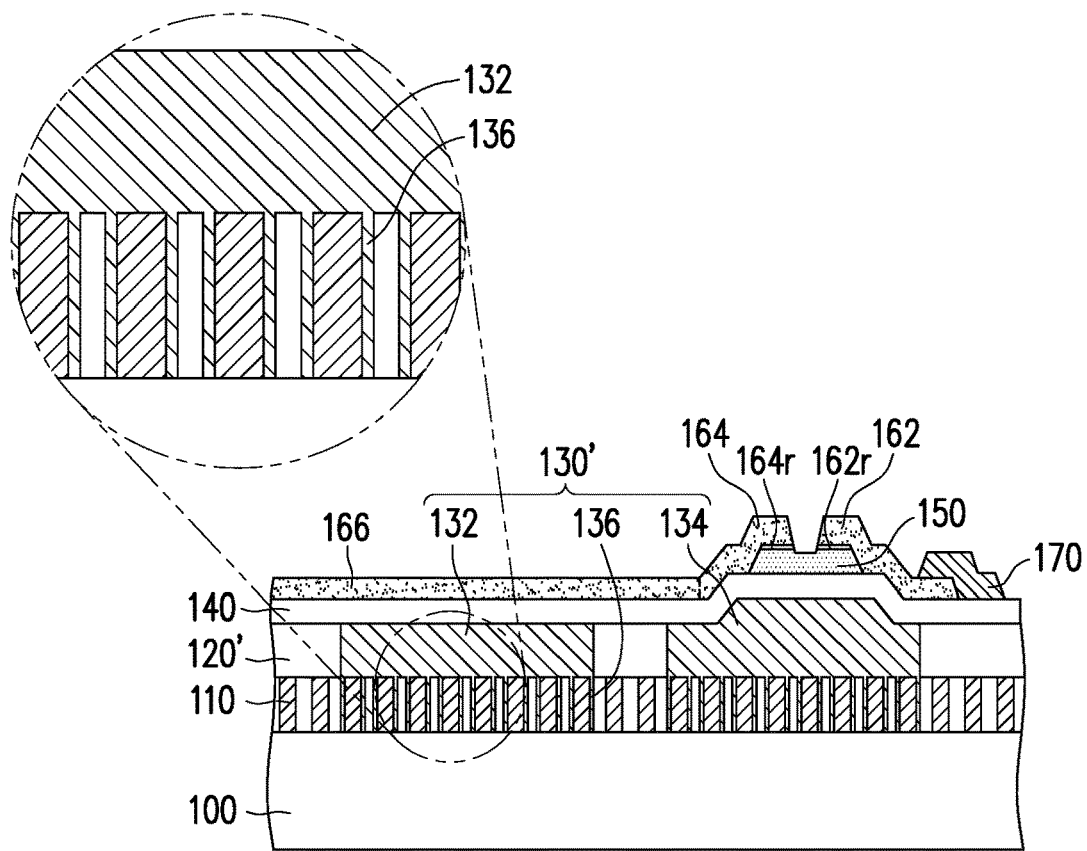
FIG. 13 is a schematic cross-sectional diagram of an active device substrate according to an embodiment of the disclosure.

FIG. 13 is a schematic cross-sectional diagram of an active device substrate according to an embodiment of the disclosure. It should be noted herein that, in the embodiment provided in FIG. 13, element numerals and partial content of the embodiment provided in FIG. 1J are followed, the same or similar reference numerals being used to represent the same or similar elements, and description of the same technical content being omitted. For a description of an omitted part, reference may be made to the foregoing embodiment, and the descriptions thereof are omitted herein.

A main difference between an active device substrate 10J in FIG. 13 and the active device substrate 10 in FIG. 1J is shown below: a first transparent conductive layer 130' of the active device substrate 10J further includes a plurality of cover layers 136.

The cover layer 136 extends downward from a scan line 132 and/or a gate 134 and covers a part of a side wall of the first metal grid wires 110. In the present embodiment, the cover layer 136 is conformal to the part of the side wall of the first metal grid wires 110. In the present embodiment, a side wall of the first metal grid wires 110 overlapped with an insulating pattern layer 120' is not covered by the cover layer 136.

In some embodiments, a gap between the first metal grid wires 110 is not completely filled by the first transparent conductive layer 130'. In other words, a gap exists between the cover layers 136 corresponding to adjacent first metal grid wires 110.

Based on the foregoing, the cover layer 136 of the first transparent conductive layer 130' covers a part of the side wall of the first metal grid wires 110 to increase a contact area between the first transparent conductive layer 130' and the first metal grid wires 110. Therefore, impedance between the first transparent conductive layer 130' and the first metal grid wires 110 may be reduced.

Figure 14:
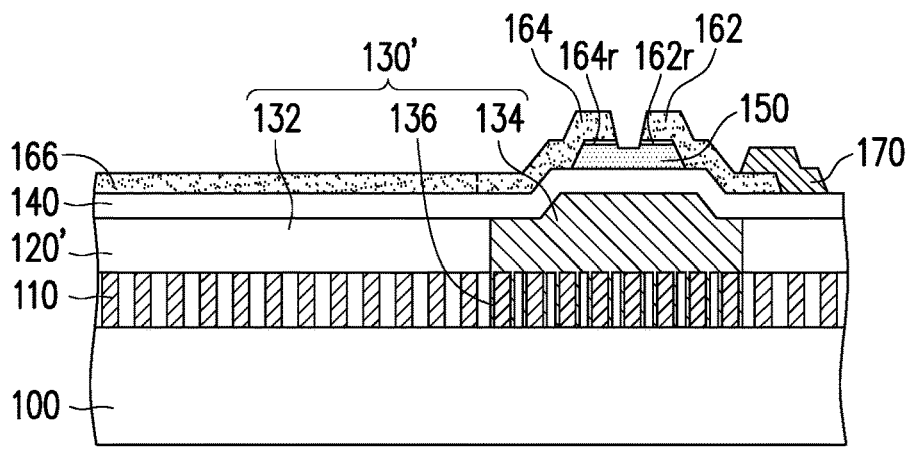
FIG. 14 is a schematic cross-sectional diagram of an active device substrate according to an embodiment of the disclosure.

FIG. 14 is a schematic cross-sectional diagram of an active device substrate according to an embodiment of the disclosure. It should be noted herein that, in the embodiment provided in FIG. 14, element numerals and partial content of the embodiment provided in FIG. 4 are followed, the same or similar reference numerals being used to represent the same or similar elements, and description of the same technical content being omitted. For a description of an omitted part, reference may be made to the foregoing embodiment, and the descriptions thereof are omitted herein.

A main difference between an active device substrate 10K in FIG. 14 and the active device substrate 10A in FIG. 4 is shown below: a first transparent conductive layer 130' of the active device substrate 10K further includes a plurality of cover layers 136.

The cover layer 136 extends downward from a scan line 132 or a gate 134 and covers a part of a side wall of first metal grid wires 110. In the present embodiment, the cover layer 136 is conformal to the part of the side wall of the first metal grid wires 110. In the present embodiment, a side wall of the first metal grid wires 110 overlapped with an insulating pattern layer 120' is not covered by the cover layer 136.

Based on the foregoing, the cover layer 136 of the first transparent conductive layer 130' covers a part of the side wall of the first metal grid wires 110 to increase a contact area between the first transparent conductive layer 130' and the first metal grid wires 110. Therefore, impedance between the first transparent conductive layer 130' and the first metal grid wires 110 may be reduced.

FIG. 15A to FIG. 15D are schematic cross-sectional diagrams of a method for manufacturing an active device substrate 10L according to an embodiment of the disclosure. Steps in FIG. 1E are followed by steps in FIG. 15A.

Figure 15A:
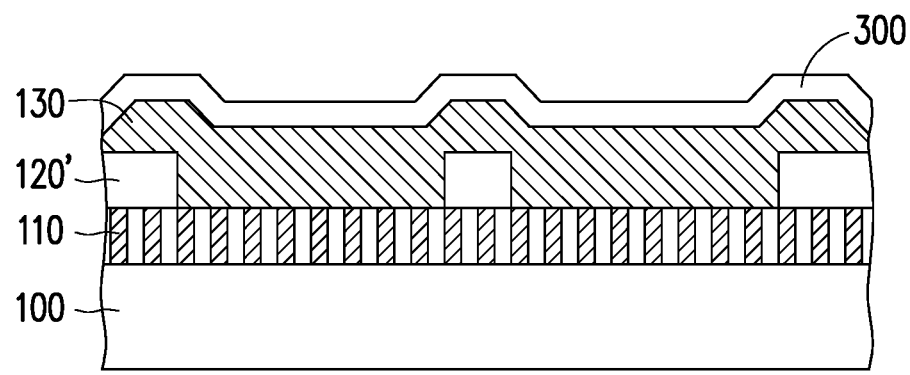
FIG. 15A to FIG. 15D are schematic cross-sectional diagrams of a method for manufacturing an active device substrate according to an embodiment of the disclosure.

With reference to FIG. 15A, after a first transparent material layer 130 is formed on an insulating pattern layer 120', a light-shielding material layer 300 is formed on the first transparent material layer 130. The light-shielding material layer 300 is a material with low transmittance, such as a metal material (such as gold, silver, copper, aluminum, molybdenum, titanium, tantalum, or alloy thereof). The light-shielding material layer 300 may be further a stacked metal material layer or a stacked layer of a metal and other materials (such as a titanium-aluminum-titanium stacked metal layer, or a molybdenum-aluminum-molybdenum stacked metal layer, etc.).

Figure 15B:
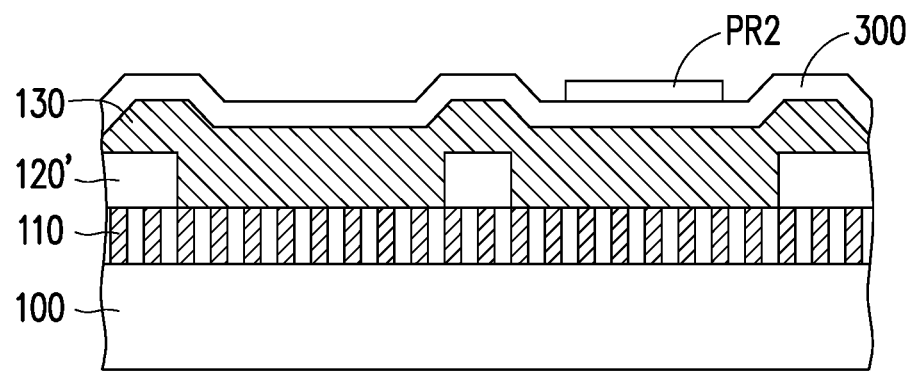

With reference to FIG. 15B, a photoresist pattern PR2 is formed on the light-shielding material layer 300. The photoresist pattern PR2 is, for example, located at a position of the first transparent material layer 130 corresponding to a gate (drawn in FIG. 15C).

Figure 15C:
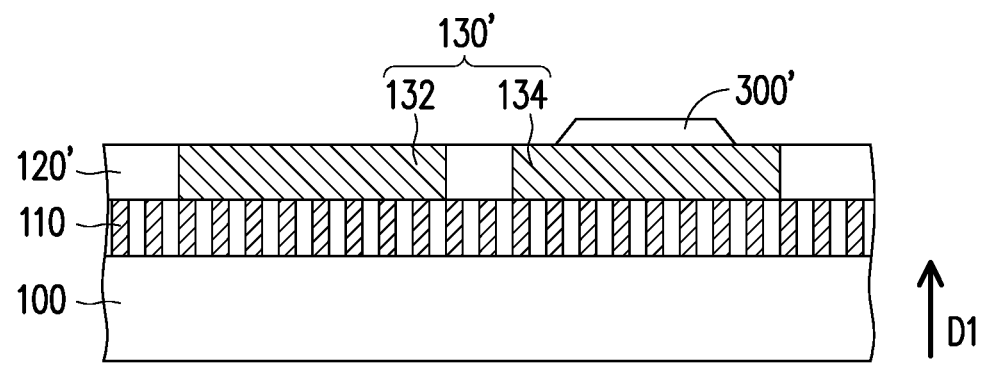

With reference to FIG. 15C, the light-shielding material layer 300 is etched by using the photoresist pattern PR2 as a mask to form a shielding electrode 300', and the first transparent material layer 130 is etched by using the photoresist pattern PR2 as a mask to form a first transparent conductive layer 130'. In the present embodiment, a part of the first transparent material layer 130 overlapped with the insulating pattern layer 120' in a direction D1 perpendicular to the substrate 100 and a part of the light-shielding material layer 300 are removed after being etched.

The first transparent conductive layer 130' includes a scan line 132 and a gate 134 connected to the scan line 132 (the scan line 132 being connected to the gate 134 in a manner similar to a manner in FIG. 2B). The shielding electrode 300' is overlapped with the gate 134 and is directly connected to the gate 134. The shielding electrode 300' may reduce an impact of light on a semiconductor layer (drawn in FIG. 15D) of an active device, thereby reducing light leakage.

Figure 15D:
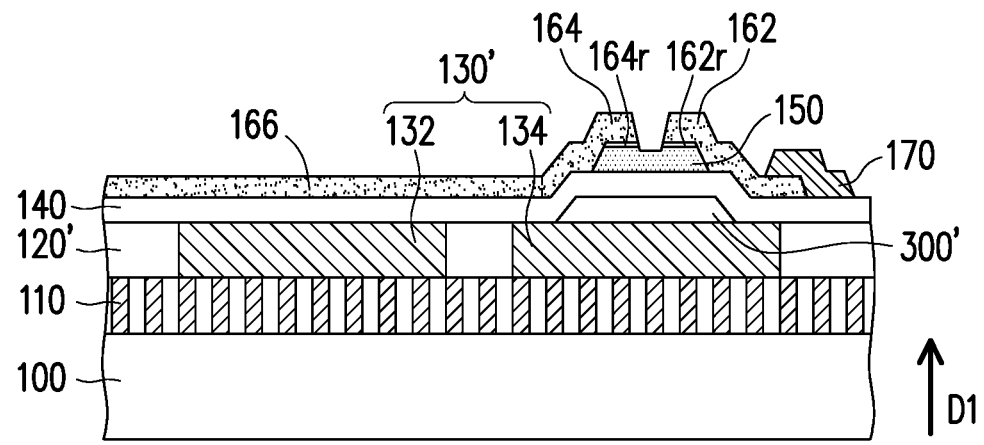

With reference to FIG. 15D, a gate insulating layer 140 is formed on the first transparent conductive layer 130'. The shielding electrode 300' is located between the gate 134 and the gate insulating layer 140.

A semiconductor layer 150 is formed on the gate insulating layer 140, and the semiconductor layer 150 is overlapped with the gate 134 in a direction D1 perpendicular to the substrate 100.

A source 162 and a drain 164 are formed on the semiconductor layer 150. A pixel electrode 166 is formed on the gate insulating layer 140. In the present embodiment, the source 162, the drain 164, and the pixel electrode 166 are made of a transparent conductive material.

Based on the foregoing, the first transparent conductive layer 130' is directly connected to at least a part of the first metal grid wires 110. Therefore, impedance of the first transparent conductive layer 130' may be reduced by using the first metal grid wires 110. In addition, because the scan line 132 includes a transparent conductive material, an impact of the scan line 134 on an aperture ratio may be reduced.

Figure 16:
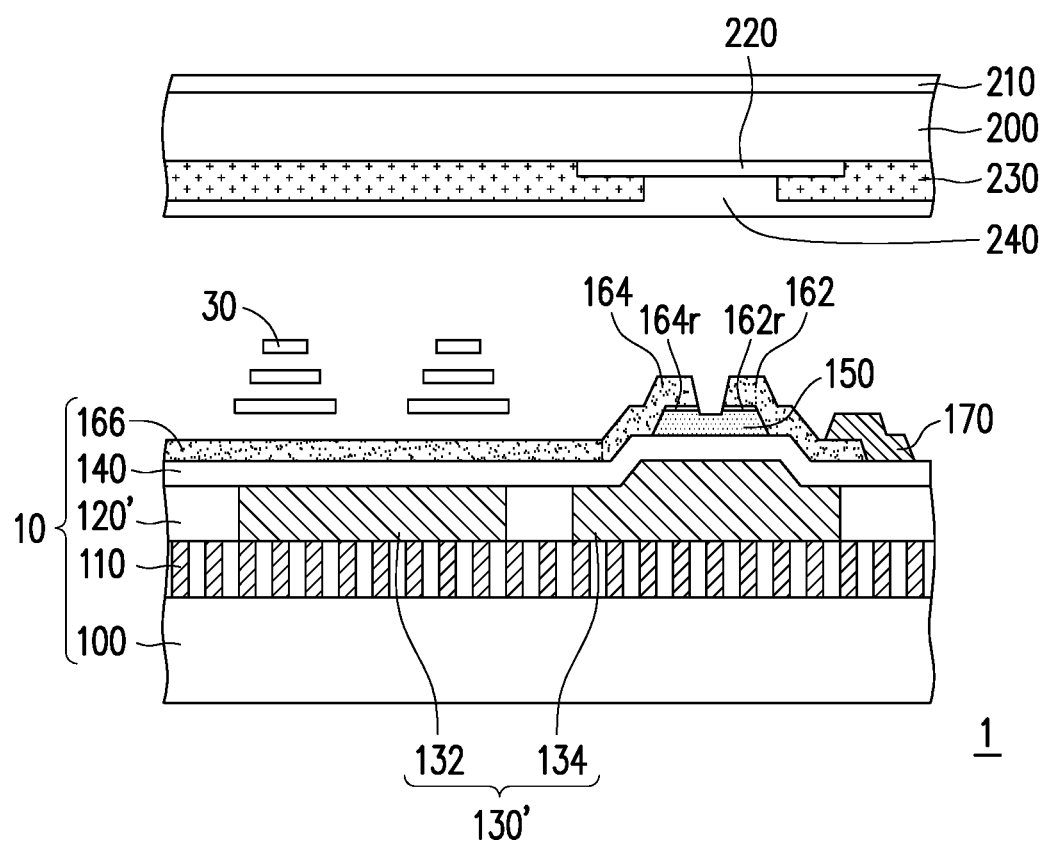
FIG. 16 is a schematic cross-sectional diagram of a display panel according to an embodiment of the disclosure.

FIG. 16 is a schematic cross-sectional diagram of a display panel according to an embodiment of the disclosure. It should be noted herein that, in the embodiment provided in FIG. 16, element numerals and partial content of the embodiment provided in FIG. 1J are followed, the same or similar reference numerals being used to represent the same or similar elements, and description of the same technical content being omitted. For a description of an omitted part, reference may be made to the foregoing embodiment, and the descriptions thereof are omitted herein.

With reference to FIG. 16, a display panel 1 includes an active device substrate 10, a counter substrate 200, and a display medium 30 located between the active device substrate 10 and the counter substrate 200.

The active device substrate 10 includes a substrate 100, a plurality of first metal grid wires 110, a first transparent conductive layer 130', a gate insulating layer 140, a semiconductor layer 150, a source 162, a drain 164, and a pixel electrode 166. The first metal grid wires 110 are located on the substrate 100. The first transparent conductive layer 130' includes a scan line 132 and a gate 134 connected to the scan line 132. The scan line 132 and/or the gate 134 is directly connected to at least a part of the first metal grid wires 110. The gate insulating layer 140 is located on the first transparent conductive layer 130'. The semiconductor layer 150 is located on the gate insulating layer 140 and overlapped with the gate 134. The source 162 and the drain 164 are electrically connected to the semiconductor layer 150. The pixel electrode 166 is electrically connected to the drain 164.

In the present embodiment, the display panel 1 further includes a polarizer 210, a black matrix 220, a color conversion element 230, and a protective layer 240.

The polarizer 210, the black matrix 220, the color conversion element 230, and the protective layer 240 are located on the counter substrate 200. In some embodiments, the polarizer 210 is made of a polyvinyl alcohol (PVA) film or triacetate cellulose (TAC) film, but the disclosure is not limited thereto. In other embodiments, the polarizer 210 includes a metal wire grid polarizer (WGP).

The black matrix 220 defines an opening area of the display panel 1. The black matrix 220 is overlapped with a non-opening area of the display panel 1, and the black matrix 220 exposes the opening area of the display panel 1. In the present embodiment, a part of the scan line 132 is not overlapped with the black matrix 220, that is, the part of the scan line 132 is disposed in the opening area.

The color conversion element 230 includes, for example, filter elements of different colors, and the black matrix 220 is disposed between the filter elements of different colors.

The protective layer 240 is located on the color conversion element 230. In some embodiments, the display panel 1 further includes a common electrode (not shown). The common electrode is disposed on the active device substrate 10 or the counter substrate 200. In some embodiments, the display medium 30 includes liquid crystal molecules, and the liquid crystal molecules may be rotated by an electric field between the common electrode and the pixel electrode 166.

Based on the foregoing, the first transparent conductive layer 130' is directly connected to at least a part of the first metal grid wires 110. Therefore, impedance of the first transparent conductive layer 130' may be reduced by using the first metal grid wires 110. In addition, because the scan line 132 includes a transparent conductive material, the impact of the scan line 134 on the aperture ratio may be reduced.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:

1. An active device substrate, comprising:
    a substrate;
    a plurality of first metal grid wires, located on the substrate;
    a first transparent conductive layer, comprising a plurality of cover layers covering a part of side walls of the first metal grid wires, a scan line and a gate connected to the scan line, wherein the scan line and/or the gate is directly connected to at least a part of the first metal grid wires;
    a gate insulating layer, located on the first transparent conductive layer;
    a semiconductor layer, located on the gate insulating layer and overlapped with the gate; and
    a source and a drain, electrically connected to the semiconductor layer.

2. The active device substrate according to claim 1, wherein a thickness of the gate is greater than a thickness of the scan line.

3. The active device substrate according to claim 1, further comprising:
    a pixel electrode, electrically connected to the drain, wherein the first metal grid wires are overlapped with the pixel electrode, the scan line, and the gate.

4. The active device substrate according to claim 3, wherein the drain, the source, and the pixel electrode belong to a same transparent conductive layer.

5. An active device substrate, comprising:
    a substrate;
    a plurality of first metal grid wires, located on the substrate;
    a first transparent conductive layer, comprising a scan line and a gate connected to the scan line, wherein the scan line and/or the gate is directly connected to at least a part of the first metal grid wires;
    a gate insulating layer, located on the first transparent conductive layer;
    a semiconductor layer, located on the gate insulating layer and overlapped with the gate; and
    a source and a drain, electrically connected to the semiconductor layer, wherein an orthogonal projection area of the first metal grid wires on the substrate is smaller than an orthogonal projection area of the first transparent conductive layer on the substrate.

6. An active device substrate, comprising:
    a substrate;
    a plurality of first metal grid wires, located on the substrate;
    a first transparent conductive layer, comprising a scan line and a gate connected to the scan line, wherein the scan line and/or the gate is directly connected to at least a part of the first metal grid wires;
    a gate insulating layer, located on the first transparent conductive layer;
    a semiconductor layer, located on the gate insulating layer and overlapped with the gate;
    a source and a drain, electrically connected to the semiconductor layer; and
    a second transparent conductive layer, comprising a pattern identical to a pattern of the first transparent conductive layer, wherein the first metal grid wires are located between the first transparent conductive layer and the second transparent conductive layer.

7. The active device substrate according to claim 6, further comprising:
- a plurality of second metal grid wires, located on the substrate, wherein the second transparent conductive layer is located between the second metal grid wires and the first metal grid wires.

8. An active device substrate, comprising:
- a substrate;
- a plurality of first metal grid wires, located on the substrate;
- a first transparent conductive layer, comprising a scan line and a gate connected to the scan line, wherein the scan line and/or the gate is directly connected to at least a part of the first metal grid wires;
- a gate insulating layer, located on the first transparent conductive layer;
- a semiconductor layer, located on the gate insulating layer and overlapped with the gate;
- a source and a drain, electrically connected to the semiconductor layer; and
- an insulating pattern layer, comprising a through hole, wherein the first metal grid wires are located under the through hole, and the scan line is located in the through hole.

9. The active device substrate according to claim 1, wherein a width of each of the first metal grid wires is 25 nm to 150 nm, and the scan line and the gate are overlapped with at least 10 of the first metal grid wires.

10. The active device substrate according to claim 1, further comprising:
- a shielding electrode, located between the gate and the gate insulating layer.

11. A method for manufacturing an active device substrate, comprising:
- forming a plurality of first metal grid wires on a substrate;
- forming an insulating pattern layer on the first metal grid wires;
- forming a first transparent material layer on the insulating pattern layer;
- patterning the first transparent material layer to form a first transparent conductive layer, wherein the first transparent conductive layer comprises a plurality of cover layers covering a part of side walls of the first metal grid wires, a scan line and a gate connected to the scan line;
- forming a gate insulating layer on the first transparent conductive layer;
- forming a semiconductor layer on the gate insulating layer, the semiconductor layer being overlapped with the gate; and
- forming a source and a drain on the semiconductor layer.

12. The method according to claim 11, wherein the step of patterning the first transparent material layer comprises:
- forming a photoresist pattern on the first transparent material layer; and
- etching the first transparent material layer by using the photoresist pattern as a mask, wherein a part of the first transparent material layer overlapped with the insulating pattern layer in a direction perpendicular to the substrate is removed after being etched.

13. The method according to claim 11, wherein the step of forming the insulating pattern layer comprises:
- forming an insulating material layer on the first metal grid wires; and
- patterning the insulating material layer to form the insulating pattern layer exposing at least a part of the first metal grid wires.

14. The method according to claim 11, further comprising:
- forming a light-shielding material layer on the first transparent material layer;
- forming a photoresist pattern on the light-shielding material layer; and
- etching the light-shielding material layer by using the photoresist pattern as a mask to form a shielding electrode, and etching the first transparent material layer by using the photoresist pattern as a mask to form the first transparent conductive layer, wherein the shielding electrode is overlapped with the gate.

* * * * *